US007765811B2

(12) United States Patent
Hershberger et al.

(10) Patent No.: US 7,765,811 B2
(45) Date of Patent: Aug. 3, 2010

(54) FLEXIBLE ASSEMBLIES WITH INTEGRATED THERMOELECTRIC MODULES SUITABLE FOR USE IN EXTRACTING POWER FROM OR DISSIPATING HEAT FROM FLUID CONDUITS

(75) Inventors: Jeffrey Gerard Hershberger, Shaker Heights, OH (US); Richard F. Hill, Parkman, OH (US); Richard I. Roser, Bellmawr, NJ (US)

(73) Assignee: Laird Technologies, Inc., Chesterfield, MO (US)

( * ) Notice: Subject to any disclaimer, the term of this patent is extended or adjusted under 35 U.S.C. 154(b) by 421 days.

(21) Appl. No.: 11/844,027

(22) Filed: Aug. 23, 2007

(65) Prior Publication Data

US 2009/0000309 A1 Jan. 1, 2009

Related U.S. Application Data

(60) Provisional application No. 60/947,261, filed on Jun. 29, 2007.

(51) Int. Cl.
*F25B 21/02* (2006.01)
*H01L 35/30* (2006.01)

(52) U.S. Cl. ............................... 62/3.5; 62/3.2; 62/3.7; 136/203; 136/205

(58) Field of Classification Search .................... 62/3.2, 62/3.5, 3.7; 136/203, 205
See application file for complete search history.

(56) References Cited

U.S. PATENT DOCUMENTS

| | | | |
|---|---|---|---|
| 4,859,250 A | 8/1989 | Buist | |
| 5,097,829 A * | 3/1992 | Quisenberry | 607/105 |
| 5,653,741 A * | 8/1997 | Grant | 607/114 |
| 6,410,971 B1 | 6/2002 | Otey | |
| 6,523,354 B1 | 2/2003 | Tolbert | |
| 6,700,052 B2 | 3/2004 | Bell | |
| 2003/0192875 A1 | 10/2003 | Bieker et al. | |
| 2005/0279105 A1* | 12/2005 | Pastorino | 62/3.7 |
| 2006/0266404 A1* | 11/2006 | Hiller et al. | 136/205 |

FOREIGN PATENT DOCUMENTS

| | | |
|---|---|---|
| DE | 19525200 | 7/1995 |
| JP | 01165183 | 6/1989 |
| JP | 2004047635 | 2/2004 |

* cited by examiner

*Primary Examiner*—Frantz F. Jules
*Assistant Examiner*—Daniel C Comings
(74) *Attorney, Agent, or Firm*—Harness, Dickey & Pierce, P.L.C.

(57) ABSTRACT

In one exemplary embodiment, an assembly includes one or more thermoelectric modules, a compliant thermal interface, and a heat spreader. The compliant thermal interface is configured such that it may substantially conform against and intimately thermally contact an outer surface of a fluid conduit. The heat spreader is disposed generally between and thermally coupled to the compliant thermal interface and the one or more thermoelectric modules. The heat spreader may have greater flexibility than the one or more thermoelectric modules. The heat spreader may also have a thermal conductivity greater than the compliant thermal interface. The assembly may have sufficient flexibility to be circumferentially wrapped at least partially around a portion of the fluid conduit's outer surface, with the compliant thermal interface in substantial conformance against and in intimate thermal contact with the fluid conduit's outer surface portion. Accordingly, a thermally-conducting heat path may thus be established from the fluid conduit to the one or more thermoelectric modules via the compliant thermal interface and the heat spreader.

27 Claims, 3 Drawing Sheets

Figure 1:
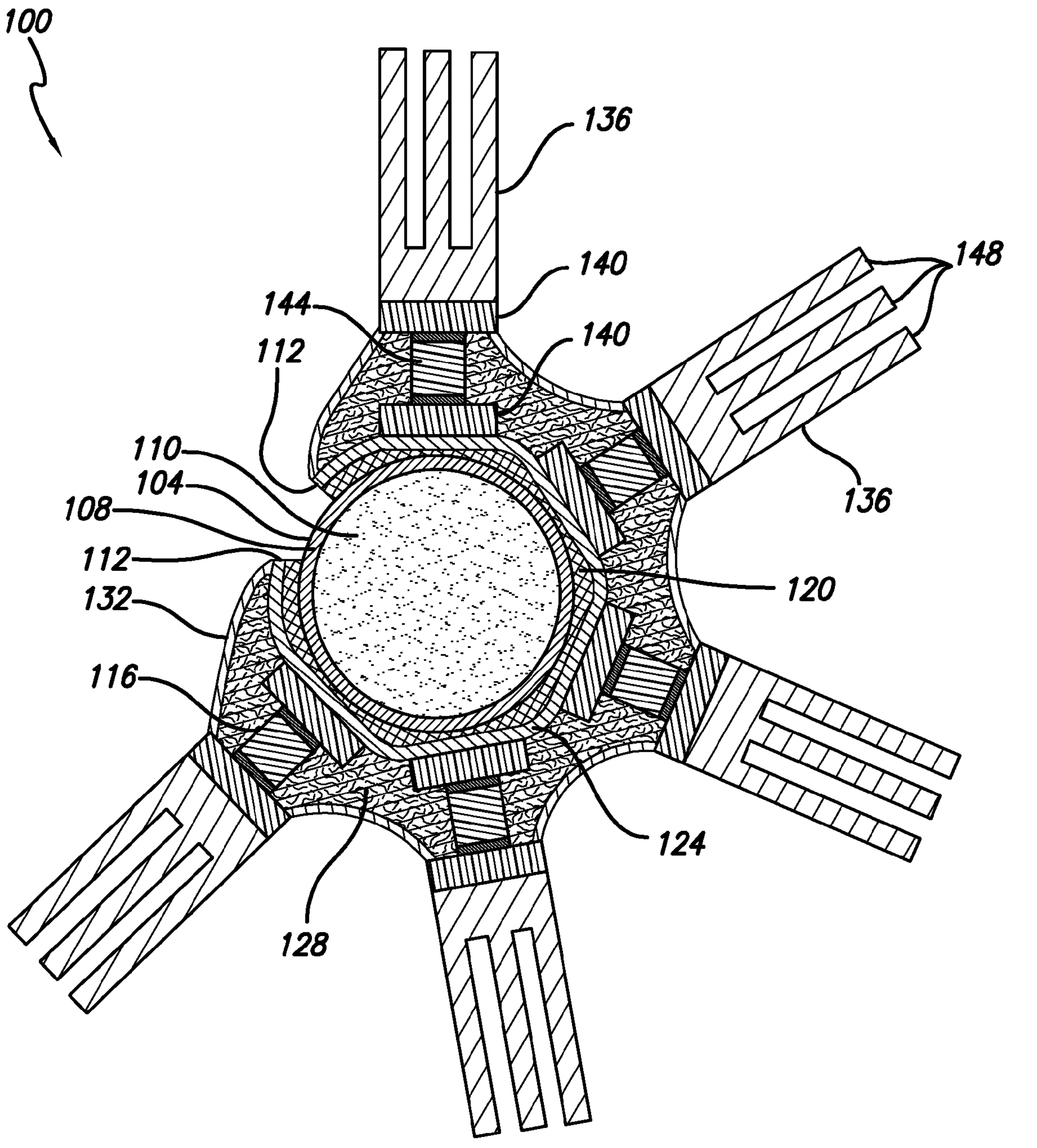

FLEXIBLE ASSEMBLIES WITH INTEGRATED THERMOELECTRIC MODULES SUITABLE FOR USE IN EXTRACTING POWER FROM OR DISSIPATING HEAT FROM FLUID CONDUITS

CROSS-REFERENCE TO RELATED APPLICATION

This application claims the benefit of U.S. Provisional Application No. 60/947,261 filed Jun. 29, 2007. The disclosure of this application is incorporated herein by reference.

FIELD

The present disclosure relates generally to thermoelectric modules and more particularly to flexible assemblies with integrated thermoelectric modules that are sufficiently flexible to be circumferentially wrapped generally about the outer surfaces of fluid conduits for use in extracting power from or cooling/dissipating heat from fluid conduits.

BACKGROUND

The statements in this section merely provide background information related to the present disclosure and may not constitute prior art.

A thermoelectric module is a relatively small solid state device that can operate as a heat pump or as an electrical power generator. When a thermoelectric module is used to generate electricity, the thermoelectric module may also be referred to as a thermoelectric generator (TEG). When a thermoelectric module is used as a heat pump, the thermoelectric module utilizes the Peltier effect to move heat and may then be referred to as a thermoelectric cooler (TEC).

By way of general background, the Peltier effect refers to the temperature change that occurs when electrical current passes through the junction of two different types of conductors. Bismuth telluride may be used as the semiconductor material, heavily doped to create either an excess (n-type) or a deficiency (p-type) of electrons. Stated simply, a TEC includes a number of p-type and n-type pairs (couples) connected electrically in series and sandwiched between two ceramic plates. When connected to a direct current power source, electrical current causes heat to move from one side of the TEC to the other. Naturally, this creates a hot side and a cold side for the TEC. A typical application exposes the cold side of the TEC to the object or substance to be cooled.

SUMMARY

According to various aspects, exemplary embodiments are provided of assemblies with integrated thermoelectric modules that are sufficiently flexible to permit wrapping of the assemblies circumferentially about the outer surfaces of fluid conduits. In one exemplary embodiment, an assembly includes one or more thermoelectric modules, a compliant thermal interface material, and a heat spreader. The compliant thermal interface material is configured such that it may substantially conform against and intimately thermally contact an outer surface of a fluid conduit. The heat spreader is disposed generally between and thermally coupled to the compliant thermal interface material and the one or more thermoelectric modules. The heat spreader may have greater flexibility than the one or more thermoelectric modules. The heat spreader may also have a thermal conductivity greater than the compliant thermal interface material. The assembly may have sufficient flexibility to be circumferentially wrapped at least partially around a portion of the fluid conduit's outer surface, with the compliant thermal interface material in substantial conformance against and in intimate thermal contact with the fluid conduit's outer surface portion. Accordingly, a thermally-conducting heat path may thus be established from the fluid conduit to the one or more thermoelectric modules via the compliant thermal interface material and the heat spreader.

Another exemplary embodiment includes an assembly suitable for use in dissipating heat transferred from a fluid conduit. The assembly includes one or more thermoelectric coolers, a compliant thermal interface material, a heat spreader, and one or more heat sinks. The compliant thermal interface material is configured to substantially conform against and intimately thermally contact an outer surface of a fluid conduit. The heat spreader is disposed generally between and thermally coupled to the compliant thermal interface material and the one or more thermoelectric coolers. The heat spreader may have greater flexibility than the one or more thermoelectric coolers. The heat spreader may also have a thermal conductivity greater than the compliant thermal interface material. Each heat sink may be thermally coupled to a corresponding one of the one or more thermoelectric coolers. The one or more heat sinks may be operable for dissipating heat to the environment. Insulation may be disposed adjacent the one or more thermoelectric coolers for helping protect the one or more thermoelectric coolers from the environment. An elastic membrane covering may be disposed generally over the insulation for helping retain the insulation generally between the covering and the heat spreader. The assembly may have sufficient flexibility to be circumferentially wrapped, from a substantially flat configuration, at least partially around a convexly curved portion of the fluid conduit's outer surface, with the compliant thermal interface material substantially confirming against and intimately thermally contacting the fluid conduit's convexly curved portion. Accordingly, a thermally-conducting heat path may be established from the fluid conduit to the one or more thermoelectric coolers via the compliant thermal interface material and the heat spreader.

Additional aspects relate to methods, such as methods associated with heat transfer from a fluid conduit. In one exemplary embodiment, a method generally includes installing an assembly onto an outer surface of a fluid conduit. The installed assembly may include one or more thermoelectric modules, a compliant thermal interface material, and a heat spreader disposed generally between the compliant thermal interface material and the one or more thermoelectric modules. When installing the assembly, the assembly may be wrapped generally circumferentially about at least a portion of the fluid conduit's outer surface such that the compliant thermal interface material substantially conforms against and intimately thermally contacts the fluid conduit outer surface portion. Accordingly, a thermally-conducting heat path may be established from the fluid conduit to the one or more thermoelectric modules via the compliant thermal interface material and the heat spreader.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

Figure 2:
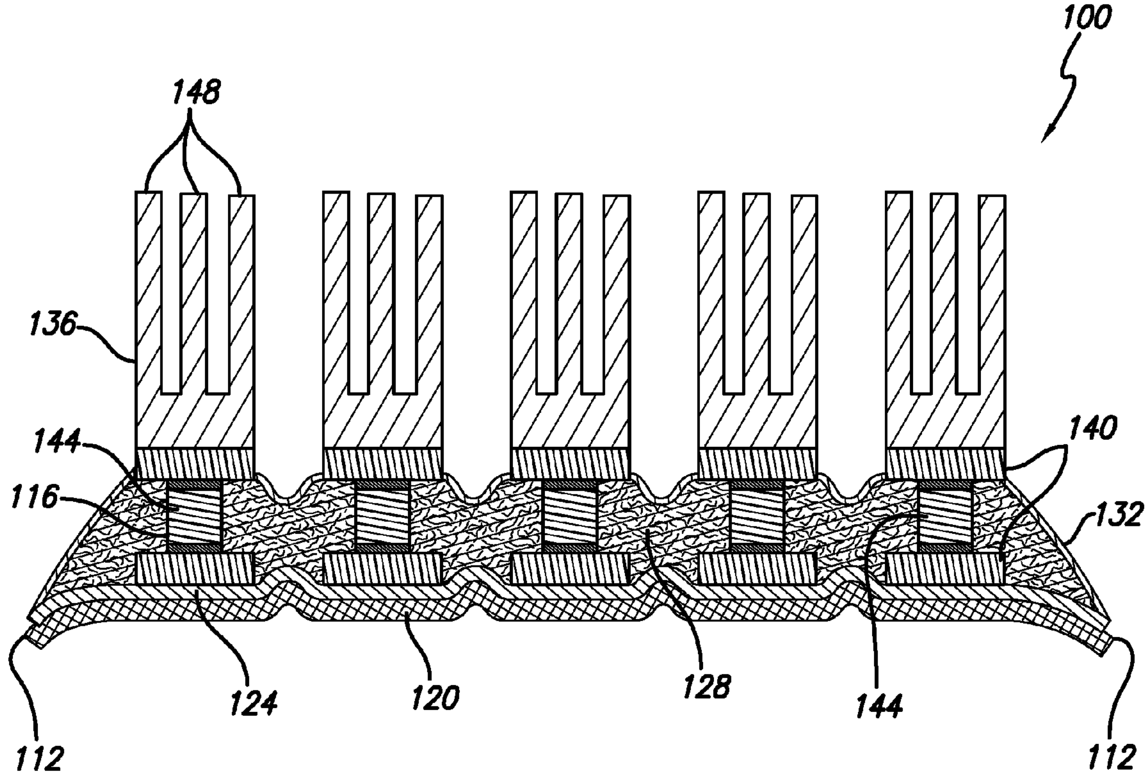
Figure 3:
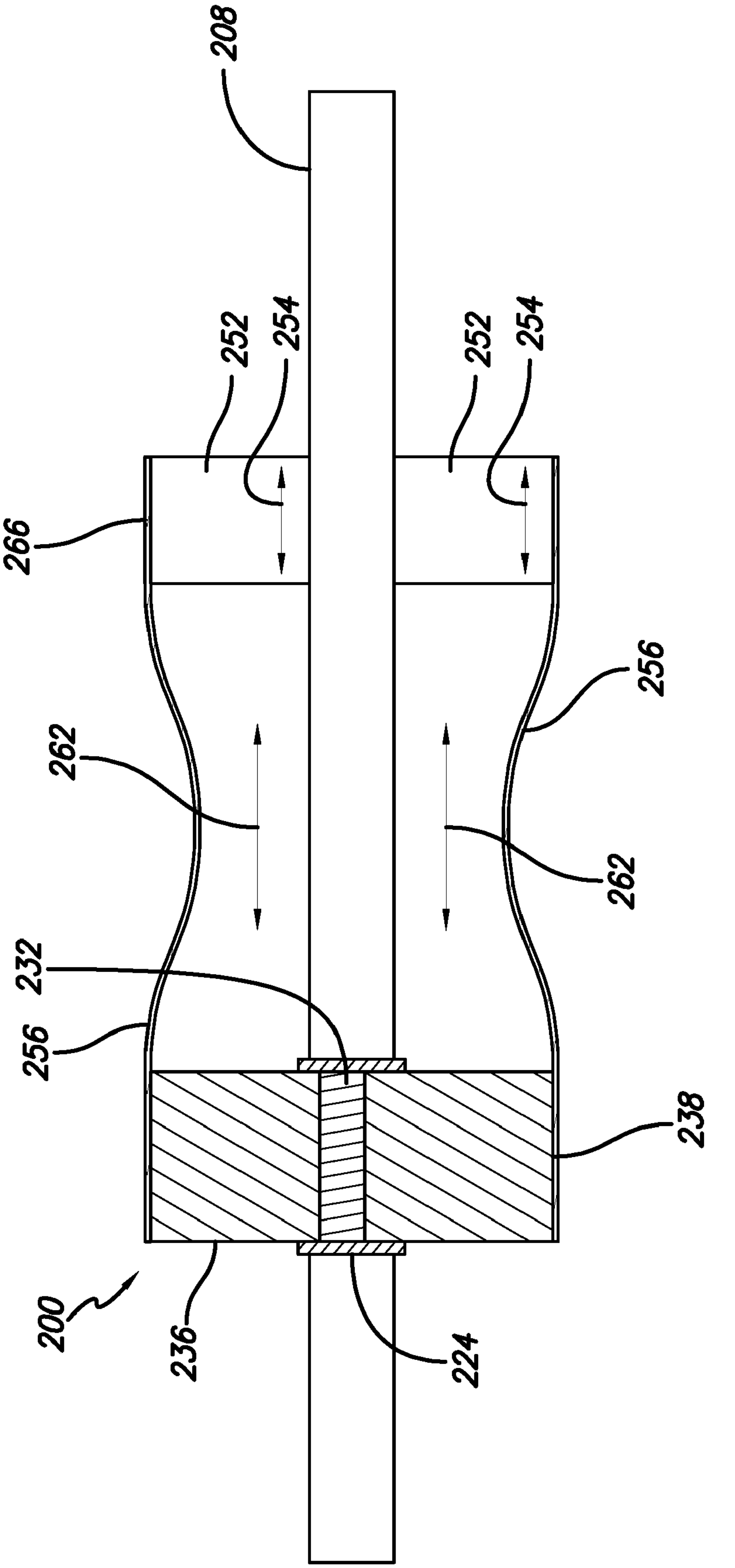

FIG. 1 is cross-sectional view of an exemplary embodiment of an assembly with integrated thermoelectric coolers and illustrating the assembly circumferentially wrapped generally about the outer surface of a pipe;

FIG. 2 is a cross-sectional view of the assembly shown in FIG. 1 with the assembly illustrated in an unwrapped flattened configuration that may be useful when shipping the assembly according to an exemplary embodiment; and FIG. 3 is a side view of an exemplary embodiment of an assembly with integrated thermoelectric coolers, two fans, and a relative thin elastic membrane wrapped about the assembly and outer surface of a pipe for enhancing airflow.

DETAILED DESCRIPTION

The following description is merely exemplary in nature and is not intended to limit the present disclosure, application, or uses. It should be understood that throughout the drawings, corresponding reference numerals indicate like or corresponding parts and features.

As recognized by the inventors hereof, some existing assemblies having thermoelectric modules are fairly rigid, generally flat, and planar. With such inflexible, flat and planar configurations, these assemblies do not lend themselves particularly well for extraction of power or heat dissipation from fluid conduits having convexly curved outer surfaces, like cylindrical pipes.

As disclosed herein, the inventors hereof have developed various exemplary embodiments of flexible assemblies with integrated thermoelectric modules that are sufficiently flexible to permit wrapping of the assemblies circumferentially about the outer surfaces of fluid conduits, including cylindrical pipes and tubes. This wrapping ability may thus allow the assemblies to be useful for extracting power from or cooling/dissipating heat from the fluid conduits about which the assemblies are wrapped.

In one exemplary embodiment, an assembly generally includes one or more generally flat, elongate (e.g., relatively long and narrow), and planar thermoelectric modules. The thermoelectric modules may be aligned generally parallel with one another when the assembly is in a first generally flat unwrapped configuration. The thermoelectric modules may be thermally connected on the pipe side by a heat spreader. The heat spreader may be formed from a relative flexible material that has a relatively high thermal conductivity, such as a copper braid. Preferably, the thermal resistance between the heat spreader and the pipe is minimized (or at least reduced) through the use of a relatively soft thermal interface material, such as a gap filler. Some examples of thermal interface materials are listed in the table below. On the hot side of the thermoelectric modules opposite the pipe, one or more heat sinks may be thermally coupled to the thermoelectric modules. The heat sinks may have one or more fins for helping dissipate heat transferred to the heat sinks to the surrounding environment.

Continuing with the description of this exemplary embodiment, insulation (e.g., compressible thermal insulation, etc.) may be disposed adjacent to the thermoelectric modules within the area or space defined generally between the heat spreader and the heat sink. The insulation is preferably configured so as to help protect the thermoelectric modules from the environment, such as foreign objects and debris, particulates, contaminants, metal scraps or shavings, etc.

In various embodiments, the assembly may be shipped and delivered as a generally flat unwrapped package. Upon receipt, the installer may flex or bend the assembly from the flat configuration and circumferentially wrap the assembly about a fluid conduit. After wrapping the assembly about the fluid conduit, the free ends or edges of the assembly may be spaced apart from each other, or the free ends may overlap each other depending on the size of fluid conduit about which the assembly is wrapped. A suitable fastening device or means (e.g., hook-and-loop fastening pads, etc.) may be used to removably attach the assembly's free ends to end other, thus also securing the relative positioning of the assembly onto the fluid conduit. In some embodiments (e.g., embodiments including hook-and-loop fastening pads, etc.), an assembly may be used and wrapped about pipes of different sizes and diameters, thereby eliminating (or at least reducing) the need to manufacture a differently sized assembly for each size of pipe or fluid conduit in a particular application.

In other embodiments, assemblies may be provided in various widths and/or with different numbers of thermoelectric modules depending, for example, on the particular application or end use (e.g., fluid conduit configuration/size/shape, heat dissipation needs, power generation needs, etc.). For applications where it is desirable to maximize or at least increase the amount of heat pumped, additional features may be provided in alternate embodiments. For example, some embodiments may include one or more heat sinks that are actively cooled by a fan (e.g., FIG. 3, etc.) integrated into the overall assembly, with airflow being directed between the fan(s) and heatsink(s), optimized, and/or enhanced by circumferentially wrapping a relative thin elastic membrane (e.g., elastomer, rubber, etc.) about the assembly. As another example, other embodiments may include one or more heat pipes (instead of, or in addition, to a fan and/or heat sink). In such embodiments, the heat pipes may lead to a separate dedicated active cooling system having one or more heat sinks and/or a fan that are not integrated into the assembly.

During operation, the heat spreader and thermal interface material (TIM) help provide and maintain a good thermally-conducting heat path between the thermoelectric modules and the exterior of the fluid conduit. Intimate thermal contact between the thermal interface material and the fluid conduit and heat spreader may help improve heat transfer efficiency from the fluid conduit to the thermoelectric modules, as compared to those applications that rely upon direct contact between the thermoelectric modules and the pipe's outer surface in which the rigidity of the thermoelectric modules typically allow for thermal contact only along a line or relative small surface portion of the pipe.

Referring now to the drawings, FIGS. 1 and 2 illustrate an exemplary embodiment of an assembly 100 embodying one or more aspects of the present disclosure. As shown in FIG. 1, the assembly 100 may be circumferentially wrapped generally about an outer surface 104 of a pipe 108 (or other fluid conduit). After being wrapped about the pipe 108, the assembly 100 may then be used for extracting power from or cooling/dissipating heat from the pipe 108 and fluid 110 within the pipe 108.

FIG. 1 illustrates the assembly 100 circumferentially wrapped generally about a cylindrical pipe having a circular cross-section or profile. Alternatively, the assembly 100 may also be used with different fluid conduits besides the pipe shown in FIG. 1, such as pipes in different sizes and shapes. For example, the assembly 100 may also be used with pipes having non-circular cross-sections (e.g., rectangular cross-sections, triangular cross-sections, ovular sections, etc.).

FIG. 2 illustrates the assembly 100 in a generally flat configuration, which may be used when shipping and delivering the assembly 100. In this generally flat and unwrapped configuration, the vertical axes of the thermoelectric modules 116 may be generally parallel with one another. Upon receipt of the assembly, the installer may then flex or bend the assembly 100 from the flat configuration shown in FIG. 2 to the wrapped configuration shown in FIG. 1. By wrapping the assembly 100 about the pipe's outer surface 104, it can be seen in FIG. 1 that the vertical axes of the thermoelectric modules 116 are no longer parallel to one another. After wrapping, the installer may secure the free ends or edges 112 of the assembly 100 by using a suitable fastening device or means, such as hook-and-loop fastening pads (e.g., Velcro pads, etc.).

In FIG. 1, the assembly 100 is illustrated as being wrapped about the substantial entirety of the circumference of the pipe 108 such as there is a relatively small spaced distance separating the assembly's free ends 112. Plus, in the illustrated embodiment, the pipe 108 has a diameter of ½ inch. In other embodiments, however, the assembly 100 may be wrapped about the circumference of the pipe 108 to a greater or lesser extent than what is shown in FIG. 1. For example, the assembly 100 may be wrapped about the entire circumference of a pipe having a smaller diameter than the pipe 108 in FIG. 1. Or, for example, the assembly 100 may be wrapped only partially about the circumference of a pipe having a larger diameter than the pipe 108 in FIG. 1. As another example, the assembly 100 may be wrapped completely about the circumference of a pipe such that the free ends 112 overlap.

With continued reference to FIGS. 1 and 2, the assembly 100 generally includes the thermoelectric modules 116, a thermal interface material 120 (some examples of which are listed below), a heat spreader 124 (e.g., copper braid, etc.), thermal insulation 128 (e.g., compressible thermal insulation, etc.), an elastic membrane covering 132, and heat sinks 136.

In this exemplary embodiment, each thermoelectric module 116 includes a single row of alternating P and N semiconductor elements 144. Each pair of P-type and N-type semiconductor elements 144 are electrically connected in series and sandwiched between plates 140. In an application where the pipe is to be cooled, the thermoelectric modules 116 may be electrically connected to one or more direct current (DC) power sources (e.g., three, six, or twelve volt power sources, etc.). The one or more power sources may be integrated into the assembly 100. Alternatively, the one or more power sources may be external to the assembly 100. In an application where power is to be extracted from heat in the pipe, the thermoelectric modules 116 may be electrically connected to a power storage circuit, as a battery charger.

In an application where the pipe is to be cooled, the amount of heat dissipated or pumped through the thermal electric modules 116 will be proportional to the power supplied thereto. Accordingly, this allows temperature to be controlled through manual or automatic means. By way of example, some embodiments may include an automatic controller, such as an on-off thermostat or a computer controlled feedback circuit.

During operation in an application where the pipe is to be cooled, electrical power is supplied to the thermoelectric modules 116. This creates an electrical current that causes heat to move from the pipe-side of the thermoelectric modules 116 to the other side. Naturally, this creates a hot side and a cold side. In FIG. 1, the cold side of the thermoelectric modules 116 is adjacent the pipe 108, and the hot side is adjacent and thermally connected to the heat sinks 136.

In some embodiments, a DC power source may be used that is significantly larger and heavier than the assembly. The DC power source may be packaged (and physically mounted) separately from the assembly. To reduce costs, some embodiments may include a commonly available DC power source capable of producing a fixed output, such as 12 volts DC. The design of the assembly (the choice of modules and the way they are electrically connected) may be altered to accommodate such a power supply. In a cooling application, the power source supplies a number of watts of power that is typically approximately equal to the number of watts of heat extracted from the pipe. To reduce costs, a relatively simple on/off thermostat controller may be used in some embodiments. Alternatively, other control devices may be used. In some embodiments, for example, a more costly and/or complex controller with a feedback circuit may be used in order to achieve more precise control over the temperature of fluid in the pipe.

In various embodiments, the plates 140 may preferably comprise metallized ceramic plates. The P and N semiconductor elements 144 may preferably comprise bismuth telluride elements. Alternative configurations (e.g., materials, shapes, sizes, more or less than five thermoelectric modules, more than a single row of P and N type semiconductor elements, etc.) may also be employed for the thermoelectric modules 116 depending, for example, on the particular application, such as the fluid conduit configuration (e.g., size, shape, material, etc.), particular fluid to be cooled, and/or power extraction or heat dissipation/cooling requirements.

A wide range of thermoelectric modules 116 may be employed in various embodiments of the present disclosure. By way of example only, the thermoelectric modules 116 may comprise thermoelectric modules commercially available from Laird Technologies, Inc.

With further reference to FIG. 2, the illustrated thermoelectric modules 116 may be generally flat with a length dimension of about 1.18 inches (about 3 centimeters), a width dimension of about 0.12 inches (about 0.3 centimeters), and a thickness dimension of about 0.13 inches (about 0.35 centimeters). In other exemplary embodiments, one or more of the thermoelectric modules 116 may be configured differently (shaped, sized, etc.) than illustrated in the figures. In addition, one or more of the dimensions (e.g., length, width, thickness, etc.) may be larger than or smaller than disclosed herein.

In the illustrated embodiment of FIG. 1, the thermal interface material 120 is disposed in direct physical contact with the heat spreader 124 and the pipe's outer surface 104. Accordingly, a thermally-conducting heat path is formed from the pipe's outer surface 104 to the heat spreader 124 via the thermal interface material 120. Because the thermal interface material 120 is preferably relatively soft, conformable and compliable, the thermal interface material 120 is able to conform and make good intimate thermal contact with the pipe's outer surface 104 and heat spreader 124. This intimate contact helps form a better heat path from the pipe 108 to the heat spreader 124 via the thermal interface material 120, as compared to a heat path formed (without using any thermal interface material 120) directly from the pipe 108 to the heat spreader 124. Alternatively, other embodiments may not include any thermal interface material 120. In such embodiments, the cold-side or pipe-side plates 140 of the thermoelectric modules 116 may make direct physical contact with the heat spreader 124 (or with the pipe outer surface 104 in those embodiments that do no not include a heat spreader or thermal interface material).

The thermal interface material 120 may be formed from a wide range of materials, which preferably are compliant or conformable materials having generally low thermal resistance and generally high thermal conductivity. Exemplary materials that may be used for the thermal interface material 120 include compliant or conformable silicone pads, silk screened materials, polyurethane foams or gels, thermal putties, thermal greases, thermally-conductive additives, gap filler materials, phase change materials, combinations thereof, etc. In some of these embodiments, the compliant or conformable materials comprise a resiliently compressible material for compressively contacting and conforming to surfaces to which they contact (e.g., the pipe's outer surface 104 and the heat spreader 124). For example, a compliant or conformable thermal interface material pad may be used having sufficient compressibility and flexibility for allowing the pad to relatively closely conform to the size and outer shape of the pipe's outer surface 104. Some embodiments include a thermal interface material pad having an adhesive backing (e.g., a thermally-conductive and/or electrically-conductive adhesive, etc.) for helping attach the assembly 100 to the pipe 108. Also, for example, a compliant or conformable thermal phase change material may be used in some embodiments. In such embodiments, the thermal phase change material may be a generally solid pad at room temperature that melts at increased temperatures to conform and make intimate contact with the pipe 108. In other embodiments, the compliant or conformable materials may comprise form-in-place materials dispensed onto the heat spreader 124 using form-in-place dispensing equipment, a hand-held dispenser, or a silk screening process, or a combination thereof, etc.

Table 1 below lists some exemplary thermal interface materials that may be used in one or more embodiments disclosed herein. These exemplary materials are commercially available from Laird Technologies, Inc. of Saint Louis, Mo., and, accordingly, have been identified by reference to trademarks of Laird Technologies, Inc. This table is provided for purposes of illustration only and not for purposes of limitation.

TABLE 1

| Name | Construction Composition | Type | Thermal Conductivity [W/mK] | Thermal Impedance [° C.-cm²/W] | Pressure of Thermal Impedance Measurement [kPa] |
|---|---|---|---|---|---|
| T-flex ™ 320 | Ceramic filled silicone elastomer | Gap Filler | 1.2 | 8.42 | 69 |
| T-flex ™ 520 | Reinforced silicone elastomer | Gap Filler | 2.8 | 2.56 | 69 |
| T-flex ™ 620 | Reinforced boron nitride filled silicone elastomer | Gap Filler | 3.0 | 2.97 | 69 |
| T-flex ™ 640 | Boron nitride filled silicone elastomer | Gap Filler | 3.0 | 4.0 | 69 |
| T-flex ™ 660 | Boron nitride filled silicone elastomer | Gap Filler | 3.0 | 8.80 | 69 |
| T-flex ™ 680 | Boron nitride filled silicone elastomer | Gap Filler | 3.0 | 7.04 | 69 |
| T-flex ™ 820 | Reinforced silicone elastomer | Gap Filler | 2.8 | 2.86 | 69 |
| T-flex ™ 6100 | Boron nitride filled silicone elastomer | Gap Filler | 3.0 | 7.94 | 69 |
| T-pli ™ 210 | Boron nitride filled, silicone elastomer, fiberglass reinforced | Gap Filler | 6 | 1.03 | 138 |
| T-grease ™ | Silicone-based grease or non-silicone based grease | Thermal Grease | 1.2 | 0.138 | 348 |

As shown in FIGS. 1 and 2, the assembly 100 includes the heat spreader 124, which preferably is formed of a relatively flexible material having high thermal conductivity. By way of example, the heat spreader 124 may be formed from a material that is a very good thermal conductor—one which has a thermal conductivity higher than that of the thermal interface material 120. In one preferred embodiment, the heat spreader 124 comprises copper braid. Alternative embodiments may include different materials being used for the heat spreader 124. Further embodiments may not include any heat spreader 124, such that the cold-side or pipe-side plates 140 of the thermoelectric modules 116 may instead make direct physical contact with the thermal interface material 120 (or with the pipe's outer surface 104 in those embodiments that do not include a thermal interface material or heat spreader).

In various preferred exemplary embodiments (e.g., FIGS. 1 and 2, etc.), the combination of thermal interface material 120 and the heat spreader 124 may improve heat transfer efficiency of the assembly 100. For example, the softness of the thermal interface material 120 may preferably allow it to conform and make good intimate thermal contact with the pipe's outer surface 104 and with the heat spreader 124. This intimate contact may thus help form a better heat path from the pipe 108 to the heat spreader 124 via the thermal interface material 120, as compared to a heat path formed (without using any thermal interface material 120) directly from the pipe 108 to the heat spreader 124. And, because the heat spreader 124 may preferably be formed from a material that is a better thermal conductor than the thermal interface material 120, the use of the heat spreader 124 may also help improve heat transfer efficiency from the thermal interface material 120 to the cold-side plates 140 of the thermoelectric modules 116.

As will be described in more detail hereinafter, the thermoelectric modules 116 may operate to cool or dissipate heat from the pipe 108 and fluid 110 therein. The heat sinks 136 may operate to radiate or dissipate heat to the surrounding environment by way of fins 148 and/or other portions of the heat sink 136. By dissipating the heat transferred thereto, the heat sinks 136 thus help keep the thermoelectric modules 116 from overheating on the hot-side plates 140 while also helping keep the cold-side or pipe-side plates 140 cool.

As shown in FIGS. 1 and 2, the assembly 100 includes five heat sinks 136. Each heat sink 136 is thermally connected to the hot-side of a corresponding thermoelectric module 116. In some embodiments, a thermal interface material (identical to or different than thermal interface material 120) may be disposed between the heat sink 136 and the thermoelectric module 116. In such embodiments, the thermal interface material may have a thermal conductivity greater than the thermal conductivities of the heat sink 136 and/or thermoelectric module 116, such that a better thermally-conducting heat path may be formed between the thermoelectric module 116 and the heat sink 136, as compared to a heat path formed (without using any thermal interface material) directly from the thermoelectric module 116 to the heat sink 136.

In other embodiments, the thermoelectric module 116 and heat sink 136 may be soldered together. In such embodiments, the thermoelectric module 116 is configured so as to withstand the soldering temperatures.

The heat sinks 136 may be formed from a wide variety of materials, which are preferably good thermal conductors. Exemplary materials that may be used include copper and copper-based alloys, beryllium-copper alloys, aluminum, brass, phosphor bronze, etc. In some embodiments, the heat sinks 136 may comprise bare or uncoated metal.

The heat sinks 136 may also include one or more cooling fins 148 that extend generally outwardly away from the heat sinks 136. The cooling fins 148 are preferably configured to improve heat dissipation and/or radiation from the heat sinks 136 to the surrounding environment. Other exemplary embodiments may include more or less than five heat sinks and/or one or more heat sinks configured differently than what is illustrated in the figures. For example, a heat sink may include more or less than three fins or no fins at all. Or, for example, a heat sink may have a different fin configuration.

Continuing with the description of the exemplary embodiment shown in FIGS. 1 and 2, the assembly 100 also includes insulation 128. The insulation 128 may be disposed adjacent the thermoelectric modules 116 and the side of the heat spreader 124 opposite the thermal interface material 120. The insulation 128 may be disposed or contained within the area or space defined generally between the heat spreader 124 and the heat sinks 136. The insulation 128 is preferably configured so as to help protect the thermoelectric modules 116 from the environment, such as foreign objects and debris, particulates, contaminants, metal scraps or shavings, etc.

A wide range of materials may be used for the insulating material 128, such as compressible thermal insulation, etc. Other examples of suitable insulating materials include fiberglass and open-cell plastic foam.

The assembly 100 may also include the seal or covering 132. The covering 132 may be disposed so as to cover and help retain the insulation 128, e.g., by inhibiting separation of the insulation 128 from the assembly 100. A wide range of materials may be used for the covering 132. In some preferred embodiments, the covering 132 comprises an elastic membrane formed from elastomer, rubber, etc. Other examples of suitable materials that may be used for the covering include nitrile rubber or latex.

A description will now be provided of an exemplary manner by which the assembly 100 may be used to cool or dissipate heat from the pipe 108 (and fluid 110 within the pipe 108). First, the assembly 100 may be received by an installer in the generally flat configuration shown in FIG. 2. The installer may then flex or bend the assembly 100 from the flat configuration to circumferentially wrap the assembly 100 generally about the outer surface 104 of the pipe 108. The installer may fasten the spaced-apart free ends or edges 112 of the assembly 100 by using a suitable fastening device or means (e.g., hook-and-loop fastening pads, etc.).

Electrical power may be supplied to the thermoelectric modules 116, which creates an electrical current that causes heat to move from the thermoelectric modules' pipe-side to the opposite side. This, in turn, creates a hot side and a cold side for each thermoelectric module 116, whereby the cold side is adjacent the pipe 108. The pipe-side plates 140 then operate to cool the pipe 108 via the heat path formed between the pipe 108 and the pipe-side plates via the thermal interface material 120 and heat spreader 124. In other words, heat is transferred from the pipe 108 to the thermal interface material 120, from the thermal interface material 120 to the heat spreader 124, and from the heat spreader 124 to the pipe-side plates 140 of the thermoelectric modules 116. This heat transfer helps cool, maintain a suitable operating temperature, and/or at least reduce the extent of the pipe 108 and/or fluid 110 temperature increase that might otherwise occur.

Due to the Peltier effect, the other plates 140 of the thermoelectric modules 116 that are adjacent and thermally connected to the heat sinks 136 are caused to substantially warm. Heat is transferred from these hot plates 140 to the heat sinks 136, from which heat dissipates or radiates to the surrounding environment (e.g., air, etc.).

FIG. 3 illustrates another exemplary embodiment of an assembly 200 embodying one or more aspects of the present disclosure. As shown in FIG. 3, the assembly 200 may be circumferentially wrapped generally about an outer surface 204 of a pipe 208 (or other fluid conduit). After being wrapped about the pipe 208, the assembly 200 may be used for cooling/dissipating heat from the pipe 208 and fluid within the pipe 208. The assembly 200 may, however, be used with different fluid conduits besides the pipe shown in FIG. 3, such as pipes in different sizes and shapes.

With continued reference to FIG. 3, the assembly 200 generally includes a heat spreader 224 (e.g., copper braid, etc.), an elastic membrane covering 232, and one or more heat sinks 236. Although not shown in FIG. 3, the assembly 200 also includes one or more thermoelectric modules, a thermal interface material, and thermal insulation, which may be arranged in a manner similar to that of the thermoelectric modules 116, thermal interface material 120, and thermal insulation 128 shown in FIGS. 1 and 2.

The assembly 200 also includes two fans 252, which may be integrated into or added to the assembly 200 for actively cooling the heat sinks 236. As represented by the double-ended arrow 245, the fans 252 may blow air in either direction towards the heatsinks 236 or away from them, depending on the particular application and configuration for the fans 252. Likewise, the direction of fluid flow in the pipe 208 may also be in either direction.

The assembly 200 further includes a relative thin membrane covering 256 circumferentially disposed or wrapped generally about the assembly 200, including fans 252. The covering 256 may thus may help direct airflow 262 in either direction (as represented by the double-ended arrow 262) depending on which way the fans 252 are blowing air, for example, to increase the heat transfer efficiency. The covering 256 may be formed from plastic, an elastic material, etc. The covering 256 may help direct airflow 262 between the fans 252 and heatsinks 236 to thereby actively cool the heat sinks 236. This, in turn, helps maximize or at least increase the amount of heat pumped. In FIG. 3, the assembly 200 includes two fans 252. Alternatively, other embodiments may include more or less than two fans (or no fans at all).

The covering 256 may be attached (e.g., with double-sided tape, or suitable attachment means, etc.) to the outsides of the fan housings 266 to form a seal and force all or substantially all air to pass through the fans 252. At the other end, the cover 256 may be attached to the tips or end portions of the heatsink fins or vanes 238. In the space between the heatsinks 236, the covering 256 may be attached to the outside of the outermost vane 238 of the heatsinks 236. The covering 256 may also be attached to any exposed portion or portions of the elastic membrane covering 232. By attaching the covering 252 in this exemplary manner, air passing between the heatsinks and the fans is forced or directed by the covering 256 to travel through the fins or vanes 248 of the heatsinks 236. Between the heatsinks 236 and the fans 252, the free edge portions of the covering 252 may be attached to each other to finish the seal, such as with double-sided tape or other suitable attachment means.

In the illustrated embodiment of FIG. 3, the arrangement is asymmetrical with the two fans 252 being mounted onto the sides of the pipe 208. Accordingly, the distance between the fans 252 and the heatsinks 236 may be important. For example, some embodiments preferably mount the fans 252 a predetermined distance away from the heatsinks 236 that is equal to or greater than twice the size of the fan. This exemplary mounting arrangement may thus allow for a more uniform airflow to develop at the heatsinks 236.

Further exemplary embodiments may include one or more heat pipes (instead of, or in addition, to fans and/or heat sinks). In such embodiments, the heat pipes may be coupled to a separate/external dedicated active cooling system, which, in turn, may include one or more heat sinks and/or fans.

Other aspects of the present disclosure relate to methods for extracting power from or cooling/dissipating heat from fluid conduits and fluids therein. In one exemplary embodiment of a method, an assembly (e.g., 100, etc.) is installed to a fluid conduit (e.g., 108, etc.) for extracting power from or dissipating heat from the fluid conduit. The assembly includes one or more thermoelectric modules (e.g., 116, etc.) thermally connected to corresponding heat sinks (e.g., 136, etc.). A thermal interface material (e.g., 120, etc.) is disposed generally between the outer surface of the fluid conduit and a heat spreader (e.g., 124). The heat spreader is disposed generally between the thermal interface material and the pipe-side plates (e.g., 140, etc.) of the thermoelectric modules. Electrical power may be provided to the thermoelectric modules to create an electrical current, which causes heat to move from the thermoelectric modules' pipe-side to their opposite side. The pipe-side plates then operate to cool the fluid conduit using the heat path formed between the fluid conduit and the pipe-side plates via the thermal interface material and heat spreader. Due to the Peltier effect, the other plates of the thermoelectric modules that are adjacent and thermally connected to the heat sinks are caused to substantially warm. Heat is transferred from these hot plates to the heat sinks, from which heat dissipates or radiates to the surrounding environment.

As used herein, the terms "dissipate" "dissipation", "heat dissipation" and other variations thereof are used to broadly describe the cooling effect, heat transfer, heat reduction, temperature reduction, thermal cooling, etc. provided by an assembly (e.g., 100, etc.) to a fluid conduit (e.g., 108) and fluid (e.g., 110) therein. The terms may include operations such as direct and/or indirect cooling, conduction cooling, convection cooling, thermally radiated cooling, etc. The terms should not be read as limitations to the scope of the present disclosure. For example, some embodiments of the assembly may not operate so to actually cool the fluid conduit or fluid therein down to some predetermined temperature. Instead, such embodiments may have an assembly that is configured to facilitate heat transfer, which, in turn, may then help maintain a more suitable temperature for the fluid conduit and/or fluid therein and/or reduce the extent of a temperature increase that might otherwise occur without such an assembly.

The materials and dimensions provided herein are for purposes of illustration only, as the assemblies and components thereof may be configured differently in different shapes, sizes, and/or from different materials depending, for example, on the particular application, such as the fluid conduit configuration (e.g., size, shape, material, etc.), fluid to be cooled or used as power source, power extraction requirements, or heat dissipation/cooling requirements.

Certain terminology is used herein for purposes of reference only, and thus is not intended to be limiting. For example, terms such as "upper", "lower", "above", "below", "top", and "bottom" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An assembly suitable for use in receiving heat transferred from a fluid conduit when the assembly is circumferentially wrapped at least partially around at least a portion of the outer surface of the fluid conduit, the assembly comprising:

one or more thermoelectric modules;

a compliant thermal interface material configured to substantially conform against and intimately thermally contact an outer surface of a fluid conduit;

a heat spreader disposed generally between and thermally coupled to the compliant thermal interface material and the one or more thermoelectric modules, the heat spreader having greater flexibility than the one or more thermoelectric modules, the heat spreader having a thermal conductivity greater than the compliant thermal interface material;

a covering disposed relative to the heat spreader such that the covering and heat spreader cooperatively define an interior portion therebetween; and one or more heat sinks thermally coupled to the one or more thermoelectric modules on a side opposite the heat spreader, the one or more heat sinks at least partially external to the interior portion;

whereby the assembly has sufficient flexibility to be circumferentially wrapped at least partially around a portion of the fluid conduit's outer surface, with the compliant thermal interface material in substantial conformance against and in intimate thermal contact with the fluid conduit's outer surface portion, to thereby establish a thermally-conducting heat path from the fluid conduit to the one or more thermoelectric modules via the compliant thermal interface material and the heat spreader.

2. The assembly of claim 1, wherein the assembly includes a first substantially flat configuration and a second configuration in which the assembly is flexed in one direction to impart a generally concave curvature to the compliant thermal interface material generally corresponding in curvature to a convexly curved portion of the fluid conduit's outer surface.

3. The assembly of claim 1, wherein the one or more thermoelectric modules comprise one or more thermoelectric generators operable for extracting electrical power from heat transferred from the fluid conduit.

4. The assembly of claim 1, wherein:

the one or more heat sinks are external to the interior portion; and/or the one or more thermoelectric modules include alternating P-type and N-type semiconductor elements, each pair of alternating P-Type and N-type semiconductor elements being electrically connected in series and sandwiched between plates, at least one of said plates being at least partially external to the interior portion.

5. The assembly of claim 1, wherein the one or more thermoelectric modules comprise one or more thermoelectric coolers operable for cooling the fluid conduit by dissipating heat transferred from the fluid conduit.

6. The assembly of claim 1, wherein the one or more heat sinks include one or more outwardly extending fins for dissipating heat to the environment.

7. The assembly of claim 1, wherein the one or more thermoelectric modules comprise two or more spaced-apart thermoelectric modules thermally coupled to the heat spreader.

8. The assembly of claim 7, wherein the two or more thermoelectric modules are spaced apart such that, when the assembly is wrapped about a cylindrical fluid conduit having a circular cross section, the two or more thermoelectric modules are arranged generally uniformly and spaced apart substantially equidistant from one another along the outer surface of the cylindrical fluid conduit.

9. The assembly of claim 1, wherein the one or more thermoelectric modules include alternating P-type and N-type semiconductor elements, each pair of alternating P-Type and N-type semiconductor elements being electrically connected in series and sandwiched between plates at least one of said plates being at least partially external to the interior portion.

10. The assembly of claim 1, further comprising insulation disposed adjacent the one or more thermoelectric modules for helping protect the one or more thermoelectric modules from the environment.

11. The assembly of claim 10, further comprising an elastic membrane covering disposed generally over the insulation for helping retain the insulation generally between the covering and the heat spreader, and wherein:

the elastic membrane covering and heat spreader cooperatively define an interior portion therebetween; and the one or more thermoelectric modules include alternating P-type and N-type semiconductor elements, each pair of alternating P-Type and N-type semiconductor elements being electrically connected in series and sandwiched between plates at least one of said plates being at least partially external to the interior portion.

12. The assembly of claim 11, wherein the insulation fills substantially all of the interior portion not occupied by the one or more thermoelectric modules.

13. The assembly of claim 1, further comprising a fastening device for removably attaching the free ends of the assembly to each other to thereby help retain the relative position of the assembly about the fluid conduit's outer surface.

14. The assembly of claim 1, wherein the thermal interface material is more compliable than the heat spreader and/or wherein the heat spreader comprises copper braid.

15. The assembly of claim 1, wherein the thermal interface material comprises a compliant or conformable material including at least one or more of:

a conformable gap filler material;

a conformable phase change material;

a thermally-conductive pad;

a thermally-conductive grease;

a thermally-conductive putty;

a form-in-place material dispensed onto the heat spreader;

a material dispensed onto the heat spreader with a hand-held dispenser;

a material silk screened onto the heat spreader;

a resiliently compressible material for compressively contacting and substantially conforming to the fluid conduit's outer surface portion; or a combination thereof.

16. The assembly of claim 1, wherein the thermal interface material comprises a gap filler including silicone elastomer and at least one thermally conductive filler such that the gap filler has a thermal conductivity of at least 1.2 Watts per meter per Kelvin.

17. The assembly of claim 1, further comprising one or more fans for generating air flow over at least a portion of the assembly to thereby improve heat dissipation from the assembly.

18. The assembly of claim 17, further comprising:

a membrane covering disposed relative to the one or more fans and the one or more heat sinks for helping direct airflow generally therebetween to thereby improve heat dissipation from the one or more heat sinks.

19. The assembly of claim 1, wherein the thermal interface material has a thermal conductivity of at least 1.2 Watts per meter per Kelvin.

20. The assembly of claim 1, wherein the thermal interface material comprises one or more of:

ceramic filled silicone elastomer;

fiberglass-reinforced silicone elastomer;

fiberglass-reinforced, boron nitride filled silicone elastomer; and/or boron nitride filled silicone elastomer.

21. An assembly suitable for use in dissipating heat transferred from a fluid conduit, the assembly comprising:

one or more thermoelectric coolers;

a compliant thermal interface material configured to substantially conform against and intimately thermally contact an outer surface of a fluid conduit;

a heat spreader disposed generally between and thermally coupled to the compliant thermal interface material and the one or more thermoelectric coolers, the heat spreader having greater flexibility than the one or more thermoelectric coolers, the heat spreader having a thermal conductivity greater than the compliant thermal interface material;

an elastic membrane covering disposed relative to the heat spreader such that the covering and heat spreader cooperatively define an interior portion therebetween; and one or more heat sinks external to the interior portion, each heat sink being thermally coupled to a corresponding one of the one or more thermoelectric coolers, the one or more heat sinks operable for dissipating heat to the environment; and insulation within the interior portion disposed adjacent the one or more thermoelectric coolers for helping protect the one or more thermoelectric coolers from the environment; and whereby the assembly has sufficient flexibility to be circumferentially wrapped, from a substantially flat configuration, at least partially around a convexly curved portion of the fluid conduit's outer surface, with the compliant thermal interface material substantially confirming against and intimately thermally contacting the fluid conduit's convexly curved portion, to thereby establish a thermally-conducting heat path from the fluid conduit to the one or more thermoelectric coolers via the compliant thermal interface material and the heat spreader.

22. The assembly of claim 21, wherein:

the thermal interface material comprises gap filler or grease having a thermal conductivity of at least 1.2 Watts per meter per Kelvin; and/or the insulation fills substantially all of the interior portion not occupied by the one or more thermoelectric coolers; and/or the thermal interface material comprises silicon elastomer and at least one thermally conductive filler.

23. A method associated with heat transfer from a fluid conduit, the method comprising:

installing an assembly onto an outer surface of a fluid conduit, the assembly including one or more thermoelectric modules, a compliant thermal interface gap filler material including silicone elastomer and at least one thermally conductive filler such that the thermal interface gap filler material has a thermal conductivity of at least 1.2 Watts per meter per Kelvin, and a heat spreader disposed generally between the compliant thermal interface gap filler material and the one or more thermoelectric modules;

wherein installing the assembly includes wrapping the assembly generally circumferentially about at least a portion of the fluid conduit's outer surface such that the compliant thermal interface gap filler material substantially conforms against and intimately thermally contacts the fluid conduit outer surface portion, to thereby establish a thermally-conducting heat path from the fluid conduit to the one or more thermoelectric modules via the compliant thermal interface gap filler material and the heat spreader.

24. The method of claim 23, wherein the method includes cooling the fluid conduit by dissipating heat transferred to the assembly.

25. The method of claim 23, wherein the method includes extracting electrical power from heat transferred to the assembly.

26. The method of claim 23, wherein installing the assembly includes flexing the assembly from a substantially flat configuration to impart a generally concave curvature to the compliant thermal interface gap filler material that generally corresponds in curvature to a convexly curved portion of the fluid conduit's outer surface.

27. The method of claim 23, further comprising providing the assembly in a substantially flat configuration to an installer before installing the assembly.

* * * * *